United States Patent
Miyoshi et al.

(10) Patent No.: US 10,923,882 B2
(45) Date of Patent: Feb. 16, 2021

(54) NITRIDE SEMICONDUCTOR LIGHT-EMITTING DEVICE

(71) Applicant: USHIO DENKI KABUSHIKI KAISHA, Tokyo (JP)

(72) Inventors: Kohei Miyoshi, Tokyo (JP); Koichi Naniwae, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/371,585

(22) Filed: Apr. 1, 2019

(65) Prior Publication Data
US 2019/0305520 A1 Oct. 3, 2019

(30) Foreign Application Priority Data
Apr. 2, 2018 (JP) .................................. 2018-071088

(51) Int. Cl.
*H01S 5/343* (2006.01)
*H01S 5/02* (2006.01)
*H01S 5/042* (2006.01)

(52) U.S. Cl.
CPC ........ *H01S 5/34333* (2013.01); *H01S 5/0206* (2013.01); *H01S 5/34346* (2013.01); *H01S 5/0425* (2013.01); *H01S 2304/04* (2013.01)

(58) Field of Classification Search
CPC ............... H01S 5/34333; H01S 5/0206; H01S 5/34346; H01S 5/0425; H01S 5/04252; H01S 2304/04
See application file for complete search history.

(56) References Cited

U.S. PATENT DOCUMENTS

| 2004/0026710 | A1* | 2/2004 | Tsuda | ..................... | B82Y 20/00 257/103 |
| 2013/0105762 | A1* | 5/2013 | Kyono | ................ | H01S 5/34333 257/13 |
| 2019/0123515 | A1* | 4/2019 | Fukagai | .............. | H01S 5/04254 |

OTHER PUBLICATIONS

Akasaka, Tetsuya et al., "High luminescent efficiency of InGaN multiple quantum wells grown on InGaN underlying layers," Applied Physics Letters vol. 85, No. 15, Oct. 19, 2004, Atsugi-shi, Kanagawa, Japan.

* cited by examiner

*Primary Examiner* — Armando Rodriguez
(74) *Attorney, Agent, or Firm* — Studebaker & Brackett PC

(57) ABSTRACT

A nitride semiconductor light-emitting device having high luminous efficiency is provided. A nitride semiconductor light-emitting device is provided with a nitride semiconductor substrate including a main surface having an off angle of 0.4° or larger with respect to a (0001) plane, a first semiconductor layer formed of an n-type or p-type nitride semiconductor formed on the main surface, a second semiconductor layer formed of a nitride semiconductor having In composition of 2% or higher formed on the first semiconductor layer, an active layer formed on the second semiconductor layer including a well layer formed of a nitride semiconductor having In composition higher than that of the second semiconductor layer and a barrier layer formed of a nitride semiconductor stacked therein, and a third semiconductor layer formed on the active layer having a conductivity type different from that of the first semiconductor layer.

10 Claims, 8 Drawing Sheets

NITRIDE SEMICONDUCTOR LIGHT-EMITTING DEVICE

BACKGROUND OF THE INVENTION

Field of the Invention

The present invention relates to a nitride semiconductor light-emitting device, and especially relates to a nitride semiconductor light-emitting device provided with a nitride semiconductor substrate.

Description of the Related Art

A nitride semiconductor light-emitting device is a device including a nitride semiconductor and is known as a light-emitting device capable of covering a wavelength range from an ultraviolet region to a visible light region in principle. Among the nitride semiconductors, GaN has a bandgap of 3.4 eV and InN has a bandgap of 0.8 eV. Therefore, by forming an active layer of InGaN which is a mixed crystal of InN and GaN and by changing In composition thereof, it is possible to realize a light-emitting device with an emission wavelength from 365 nm to 1550 nm in principle. That is, in order to shift the emission wavelength from 365 nm to a longer wavelength side, it is necessary to increase the In composition of the nitride semiconductor layer forming the active layer.

However, a problem is known that, when growing the nitride semiconductor layer having increased In composition, a crystal quality of the nitride semiconductor layer is deteriorated and luminous efficiency in the active layer is lowered. In response to such a problem, for example, following Non-Patent Document 1 proposes a technology of growing an InGaN layer as an underlayer of an active layer and growing the active layer on this InGaN layer (refer to, for example, following Non-Patent Document 1).

PRIOR ART DOCUMENT

Non-Patent Document

Non-Patent Document 1: T. Akasaka et al., "High luminescent efficiency of InGaN multiple quantum wells grown on InGaN underlying layers", Appl. Phys. Lett. 85 (2004) 3089-3091

BRIEF SUMMARY OF THE INVENTION

Problems to be Solved by the Invention

However, in the nitride semiconductor light-emitting device provided with the active layer containing the nitride semiconductor with high In composition, high luminous efficiency is not yet realized at the present time and there is room for improvement. An object of the present invention is to provide a nitride semiconductor light-emitting device having high luminous efficiency.

Means for Solving the Problem

The inventors of the present application have manufactured a nitride semiconductor light-emitting device provided with an active layer containing a nitride semiconductor of high In composition, and confirmed that a planar defect is generated in the active layer. A portion where this planar defect is generated has been confirmed as a dark spot by a fluorescence microscope. From such a viewpoint, the inventors of the present application have imagined that it is possible to improve luminous efficiency of the nitride semiconductor light-emitting device by lowering generation density of planar defects, and achieved the present invention.

A nitride semiconductor light-emitting device according to the present invention is provided with:

a nitride semiconductor substrate including a main surface having an off angle of 0.4° or larger with respect to a (0001) plane;

a first semiconductor layer formed of an n-type or p-type nitride semiconductor formed on the main surface of the nitride semiconductor substrate;

a second semiconductor layer formed of a nitride semiconductor having In composition of 2% or higher formed on the first semiconductor layer;

an active layer formed on the second semiconductor layer including a well layer formed of a nitride semiconductor having In composition higher than the In composition of the second semiconductor layer and a barrier layer formed of a nitride semiconductor stacked therein; and a third semiconductor layer formed on the active layer having a conductivity type different from the conductivity type of the first semiconductor layer.

As in the above-described configuration, by forming the second semiconductor layer containing In on the main surface having the off angle of 0.4° or larger with respect to the (0001) plane, and further forming the active layer including the well layer having high In composition thereon, generation of a dark spot in the active layer can be inhibited. By setting this off angle to 0.5° or larger and 1.0° or smaller, the generation of dark spots can be further suppressed.

In this specification, the expression "a layer Y is formed on a layer X" means not only a case where the layer Y is directly formed on the surface of the layer X but also a case where the layer Y is formed on the surface of the layer X via another layer.

In this specification, the description "AlGaN" is synonymous with the description of $Al_mGa_{1-m}N$ (0<m<1) in which description of a composition ratio (mixed crystal ratio) of Al and Ga is simply abbreviated; this is not intended to limit to a case where the composition ratio of Al and Ga is 1:1. The same applies to descriptions such as "InGaN" and "AlInGaN".

In this specification, a symbol "−" immediately preceding the number in the parentheses indicating the Miller index indicates inversion of the index and is synonymous with "bar" on top of the number in the drawing. A <1-100> direction is a concept including a [1-100] direction and directions crystallographic ally equivalent to the [1-100] direction, that is, a [10-10] direction, a [01-10] direction, a [−1100] direction, a [−1010] direction, and a [0-110] direction.

The second semiconductor layer may have a thickness of 100 nm or larger. As a result, surface energy of a crystal forming the second semiconductor layer is lowered, so that an effect of suppressing generation of defects in the active layer to be formed later is enhanced.

The second semiconductor layer may have a surface in contact with the active layer. As a result, since the active layer is grown taking over a state in which the surface energy of the crystal is lowered, the effect of suppressing the generation of defects in the active layer is enhanced.

The nitride semiconductor light-emitting device may be provided with a fourth semiconductor layer formed between the main surface of the nitride semiconductor substrate and the first semiconductor layer formed of a nitride semiconductor having In composition of 2% or higher, the In composition lower than that of the well layer. As a result, there is an effect that warp of the substrate is reduced and introduction of partial crystal lattice strain alleviation leads to suppression of segregation of In during growth of the active layer, the second semiconductor layer, and the fifth semiconductor layer.

The nitride semiconductor substrate may have the main surface inclined in the <1-100> direction with respect to the (0001) plane.

The barrier layer may be formed of a nitride semiconductor containing In and Ga. The barrier layer may be formed of a nitride semiconductor having In composition lower than that of the well layer.

The second semiconductor layer may be formed in a position within 500 nm toward the nitride semiconductor substrate from a surface on a side closer to the nitride semiconductor substrate of the active layer. As a result, since the active layer is formed in the vicinity of the surface after the growth of the second semiconductor layer, this may take over a state in which the surface energy of the crystal is lowered, and the effect of suppressing the generation of defects in the active layer is enhanced.

The well layer may be formed of a nitride semiconductor having In composition of 10% or higher. In other words, the nitride semiconductor light-emitting device may have a main emission wavelength of 430 nm or longer. Furthermore, the well layer may be formed of a nitride semiconductor having In composition of 10% or higher and 30% or lower. In other words, the nitride semiconductor light-emitting device may be formed of a nitride semiconductor having a main emission wavelength of 430 nm or longer and 530 nm or shorter.

The well layer may be formed of a nitride semiconductor containing Al. Specifically, the well layer may be formed of a quaternary mixed crystal of AlInGaN. By allowing the well layer to contain Al, a surface diffusion length of In decreases during crystal growth, and the effect of suppressing the generation of dark spots due to the segregation of In is further enhanced.

The nitride semiconductor light-emitting device may be a laser device.

Effect of the Invention

According to the present invention, generation of planar defects in the active layer may be suppressed, so that a nitride semiconductor light-emitting device having high luminous efficiency is realized.

DETAILED DESCRIPTION OF THE INVENTION

Figure 1:
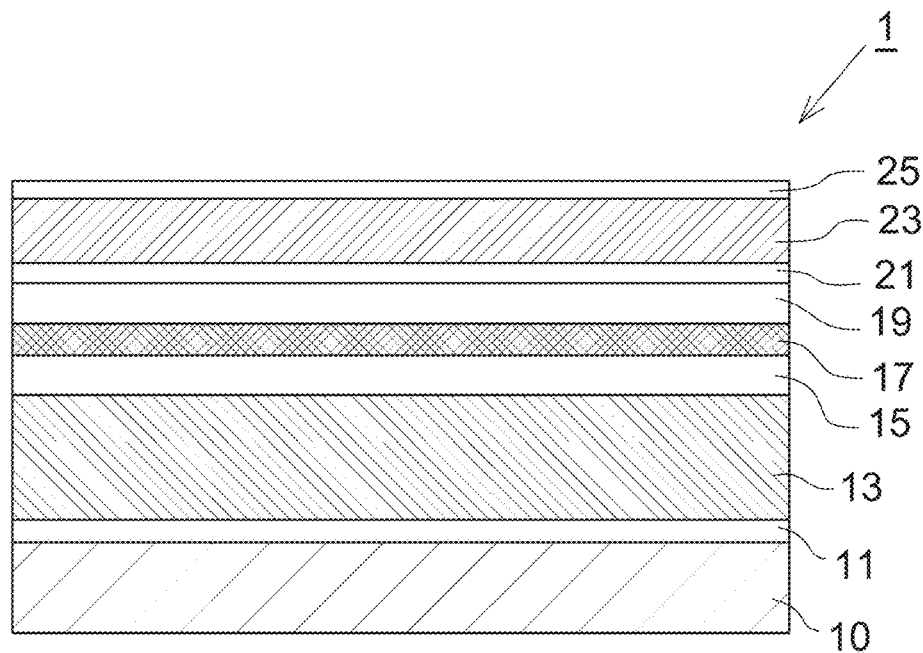
FIG. 1 is a cross-sectional view schematically illustrating a structure of a nitride semiconductor light-emitting device of the present invention.

A nitride semiconductor light-emitting device of the present invention is described with reference to the drawings. Note that, in each drawing, a dimensional ratio in the drawing does not necessarily coincide with an actual dimensional ratio.

Structure

FIG. 1 is a cross-sectional view schematically illustrating a structure of one embodiment of a nitride semiconductor light-emitting device. A nitride semiconductor light-emitting device 1 is provided with a nitride semiconductor substrate 10, a first semiconductor layer 13, a second semiconductor layer 15, an active layer 17, and a third semiconductor layer 23.

Note that, in the example illustrated in FIG. 1, the nitride semiconductor device 1 is further provided with a fourth semiconductor layer 11, a fifth semiconductor layer 19, a sixth semiconductor layer 21, and a seventh semiconductor layer 25.

Nitride Semiconductor Substrate 10

Figure 2:
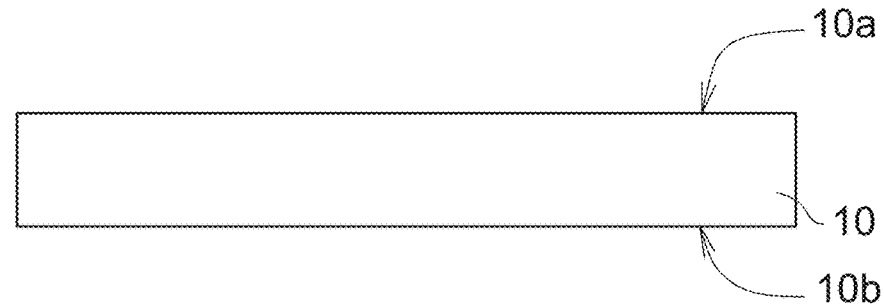
FIG. 2 is a cross-sectional view schematically illustrating a structure of a nitride semiconductor substrate provided in the nitride semiconductor light-emitting device.

The nitride semiconductor substrate 10 is formed of GaN, AlGaN, or AlInGaN, and preferably formed of GaN. As illustrated in FIG. 2, the nitride semiconductor substrate 10 includes a main surface 10a and a rear surface 10b on a side opposite to the main surface 10a.

Figure 3A:
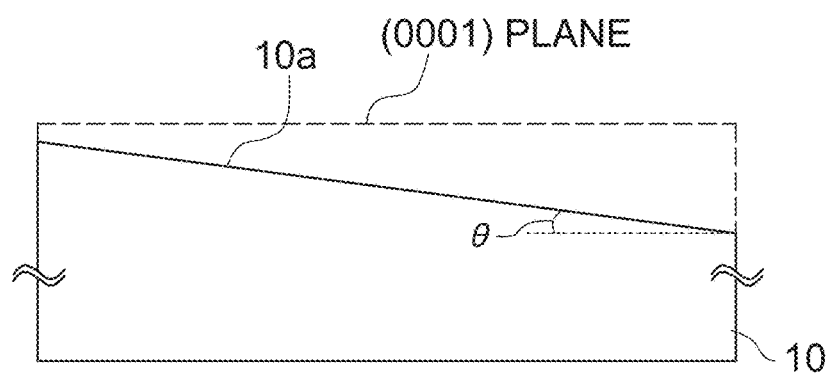
FIG. 3A is a schematic enlarged view of a main surface of the nitride semiconductor substrate.
Figure 3B:
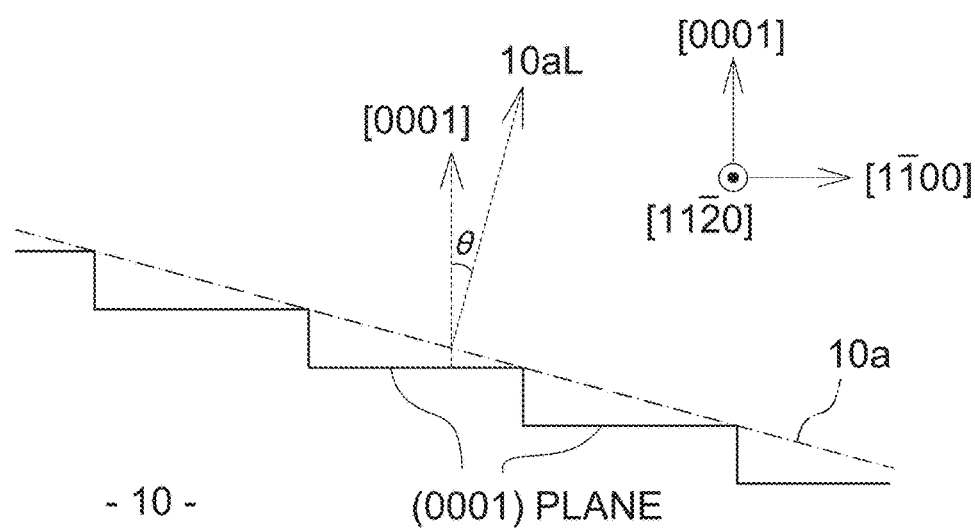
FIG. 3B is a schematic enlarged view of the main surface of the nitride semiconductor substrate.
Figure 3C:
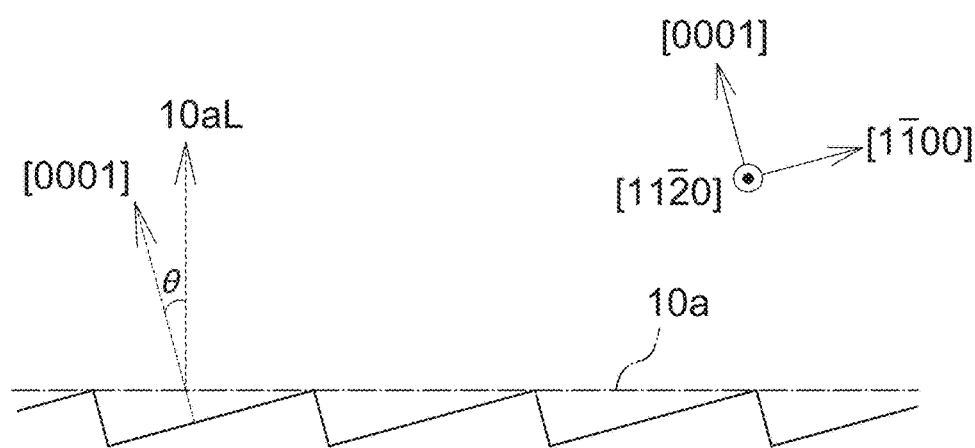
FIG. 3C is a schematic enlarged view of the main surface of the nitride semiconductor substrate.

In the nitride semiconductor substrate 10, the main surface 10a is inclined by an off angle θ with respect to a c plane, that is, a (0001) plane. FIGS. 3A, 3B, and 3C are schematic enlarged views of the main surface 10a of the nitride semiconductor substrate 10. FIGS. 3B and 3C illustrate a case where the main surface 10a of the nitride semiconductor substrate 10 is inclined by the off angle θ with respect to the (0001) plane in a [1-100] direction (right direction of paper surface).

As illustrated in FIGS. 3B and 3C, a direction 10aL orthogonal to the main surface 10a is inclined by the off angle θ with respect to a [0001] direction. FIG. 3B is a view with the [0001] direction directed upward of a paper surface, and FIG. 3C is a view with the direction 10aL orthogonal to the main surface 10a of the nitride semiconductor substrate 10 directed upward of the paper surface. As illustrated in FIGS. 3B and 3C, a minute step is formed on the main surface 10a of the nitride semiconductor substrate 10.

Note that, also on a nitride semiconductor substrate a main surface of which is a (0001) plane substrate with no off angle θ unlike the nitride semiconductor substrate 10, a minute step is inevitably generated microscopically.

The off angle θ formed on the main surface 10a of the nitride semiconductor substrate 10 is 0.4° or larger, and preferably 0.5° or larger. In addition, the off angle θ is preferably 5° or smaller, and more preferably 1° or smaller.

In this embodiment, the nitride semiconductor substrate 10 may be doped with an n-type impurity, may be doped with a p-type impurity, or may be undoped.

The nitride semiconductor substrate 10 including the main surface 10a with the off angle θ is manufactured by various methods. As an example, a method of preparing the nitride semiconductor substrate 10 with the (0001) plane as a growth face, then cutting the nitride semiconductor substrate 10 at a plane inclined by the off angle θ in the [1-100] direction from the (0001) plane, and making this cut surface the main surface 10a may be adopted.

As another example, a method of forming the off angle θ on a heterogeneous substrate of sapphire, SiC, Si and the like, then growing a nitride semiconductor layer (for example, a GaN layer) on the heterogeneous substrate, and removing the heterogeneous substrate may be adopted. As still another method, a method of etching the main surface 10a of the nitride semiconductor substrate 10 so as to form a minute inclination angle θ, a method of applying surface treatment by polishing and irradiation with laser to the main surface 10a so as to form the minute inclination angle θ may also be adopted.

Fourth Semiconductor Layer 11

The nitride semiconductor device 1 of this embodiment is provided with the fourth semiconductor layer 11 on the main surface 10a of the nitride semiconductor substrate 10. The fourth semiconductor layer 11 is formed of InGaN or AlInGaN. A composition ratio of In contained in the fourth semiconductor layer 11 is 2% or higher and 15% or lower, and preferably 2% or higher and 10% or lower. The composition ratio of In contained in the fourth semiconductor layer 11 is at least lower than a composition ratio of In in a well layer 17a to be described later.

A thickness of the fourth semiconductor layer 11 is 50 nm or larger and 250 nm or smaller, and preferably 100 nm or larger and 200 nm or smaller. As an example, the fourth semiconductor layer 11 is formed of $In_{0.05}Ga_{0.95}N$ having the thickness of 150 nm.

The fourth semiconductor layer 11 may be doped with an n-type impurity, may be doped with a p-type impurity, or may be undoped.

First Semiconductor Layer 13

The nitride semiconductor device 1 of this embodiment is provided with the first semiconductor layer 13 formed on an upper surface of the fourth semiconductor layer 11. As described above, since the fourth semiconductor layer 11 is formed on the main surface 10a of the nitride semiconductor substrate 10 having the off angle θ, the first semiconductor layer 13 also grow with this off angle θ. Note that the same applies to the following semiconductor layers.

The first semiconductor layer 13 is formed of AlGaN or AlInGaN. A composition ratio of Al contained in the first semiconductor layer 13 is 1% or higher and 15% or lower, and preferably 3% or higher and 10% or lower.

In this embodiment, the first semiconductor layer 13 is doped with an n-type impurity such as Si, Ge, S, Se, Sn, Te or the like, for example, and dopant is preferably Si. An impurity concentration of the first semiconductor layer 13 is $1\times10^{17}/cm^3$ or higher and $5\times10^{19}/cm^3$ or lower, and preferably $3\times10^{17}/cm^3$ or higher and $2\times10^{19}/cm^3$ or lower.

A thickness of the first semiconductor layer 13 is 300 nm or larger and 2000 nm or smaller, and preferably 500 nm or larger and 1500 nm or smaller. As an example, the first semiconductor layer 13 is formed of n-type $Al_{0.05}Ga_{0.95}N$ having the thickness of 1000 nm (1 μm).

Second Semiconductor Layer 15

The nitride semiconductor device 1 of this embodiment is provided with the second semiconductor layer 15 formed on an upper surface of the first semiconductor layer 13. The second semiconductor layer 15 is formed of InGaN or AlInGaN. A composition ratio of In contained in the second semiconductor layer 15 is 2% or higher and 15% or lower, and preferably 2% or higher and 10% or lower. The composition ratio of In contained in the second semiconductor layer 15 is at least lower than the composition ratio of In contained in the well layer 17a to be described later.

A thickness of the second semiconductor layer 15 is preferably 100 nm or larger and 500 nm or smaller, and more preferably 150 nm or larger and 300 nm or smaller. As an example, the second semiconductor layer 15 is formed of $In_{0.03}Ga_{0.97}N$ having the thickness of 250 nm.

The second semiconductor layer 15 may be doped with an n-type impurity or may be undoped.

Active Layer 17

The nitride semiconductor device 1 of this embodiment is provided with the active layer 17 formed on an upper surface of the second semiconductor layer 15. The active layer 17 includes a quantum well structure and may include a multiple quantum well structure or a single quantum well structure, but the active layer 17 preferably includes the multiple quantum well structure.

Figure 4:
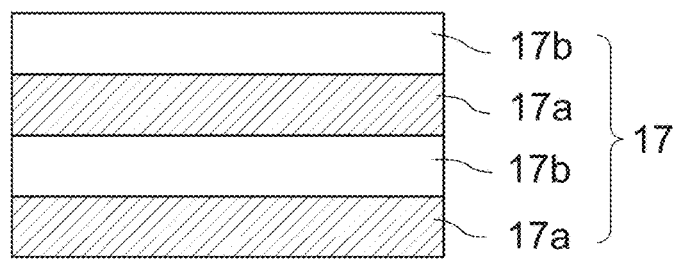
FIG. 4 is an example of a cross-sectional view schematically illustrating a structure of an active layer.

FIG. 4 is an example of a cross-sectional view schematically illustrating a structure of the active layer 17. In the example illustrated in FIG. 4, the active layer 17 includes the multiple quantum well structure in which two cycles of the well layer 17a and a barrier layer 17b are stacked. Note that, when the active layer 17 includes the multiple quantum well structure, an end on the n-type semiconductor layer side and/or an end on the p-type semiconductor layer side may be the well layer 17a and may be the barrier layer 17b. In addition, the barrier layer 17b interposed between the two well layers 17a is not limited to one layer, and may be formed of two or more layers having different compositions or amounts of contained impurities.

The well layer 17a is formed of InGaN or AlInGaN. An emission wavelength of the nitride semiconductor light-emitting device 1 is determined by the composition ratio of In being a constituent material of the well layer 17a. In this embodiment, the In composition ratio of the well layer 17a is preferably 10% or higher and 30% or lower. In this case, the emission wavelength of the nitride semiconductor light-emitting device 1 is 430 nm or larger and 530 nm or smaller.

The well layer 17a may be doped with an n-type impurity or may be undoped. Although a thickness of the well layer 17a is arbitrary, the thickness is preferably 2 nm or larger and 10 nm or smaller, and more preferably 2.5 nm or larger and 5 nm or smaller.

The barrier layer 17b is formed of GaN, or InGaN or AlInGaN with a lower In composition ratio than that of the well layer 17a. In this embodiment, an In composition ratio of the barrier layer 17b is preferably 0% or higher and 5% or lower, and more preferably 2% or higher and 5% or lower.

The barrier layer 17b may be doped with an n-type impurity or may be undoped. Although a thickness of the barrier layer 17b is arbitrary, the thickness is preferably 1 nm or larger and 30 nm or smaller, and more preferably 3 nm or larger and 10 nm or smaller.

Fifth Semiconductor Layer 19

The nitride semiconductor device 1 of this embodiment is provided with the fifth semiconductor layer 19 formed on an upper surface of the active layer 17. As is the case with the second semiconductor layer 15, the fifth semiconductor layer 19 is formed of InGaN or AlInGaN. A composition ratio of In contained in the fifth semiconductor layer 19 is 2% or higher and 15% or lower, and preferably 2% or higher and 10% or lower. The composition ratio of In contained in the fifth semiconductor layer 19 is at least lower than the composition ratio of In contained in the well layer 17a.

A thickness of the fifth semiconductor layer 19 is preferably 100 nm or larger and 500 nm or smaller, and more preferably 150 nm or larger and 300 nm or smaller. As an example, the fifth semiconductor layer 19 is formed of $In_{0.02}Ga_{0.98}N$ having the thickness of 250 nm.

The fifth semiconductor layer 19 may be doped with a p-type impurity or may be undoped.

Sixth Semiconductor Layer 21

The nitride semiconductor device 1 of this embodiment is provided with the sixth semiconductor layer 21 formed on an upper surface of the fifth semiconductor layer 19.

The sixth semiconductor layer 21 is formed of AlGaN or AlInGaN. A composition ratio of Al contained in the sixth semiconductor layer 21 is preferably 5% or higher and 30% or lower, more preferably 5% or higher and 15% or lower.

The sixth semiconductor layer 21 is doped with a p-type impurity such as Mg, Be, Zn, or C, and dopant is preferably Mg. An impurity concentration of the sixth semiconductor layer 21 is $7\times10^{18}/cm^3$ or higher and $5\times10^{19}/cm^3$ or lower, and preferably $1\times10^{19}/cm^3$ or higher and $3\times10^{19}/cm^3$ or lower.

A thickness of the sixth semiconductor layer 21 is 5 nm or larger and 30 nm or smaller and preferably 5 nm or larger and 20 nm or smaller. As an example, the sixth semiconductor layer 21 is formed of p-type $Al_{0.1}Ga_{0.9}N$ having the thickness of 10 nm. When the first semiconductor layer 13 is the n-type semiconductor layer and the third semiconductor layer 23 is the p-type semiconductor layer, the sixth semiconductor layer 21 serves as a block layer which inhibits an inflow of electrons into the third semiconductor layer 23.

Third Semiconductor Layer 23

The nitride semiconductor device 1 of this embodiment is provided with the third semiconductor layer 23 formed on an upper surface of the sixth semiconductor layer 21.

The third semiconductor layer 23 is formed of AlGaN or AlInGaN. A composition ratio of Al contained in the third semiconductor layer 23 is lower than that of the sixth semiconductor layer 21, the composition ratio is preferably 1% or higher and 15% or lower, and more preferably 3% or higher and 10% or lower.

The third semiconductor layer 23 is doped with a p-type impurity such as Mg, Be, Zn, or C, and dopant is preferably Mg. An impurity concentration of the third semiconductor layer 23 is $7\times10^{18}/cm^3$ or higher and $5\times10^{19}/cm^3$ or lower, and preferably $1\times10^{19}/cm^3$ or higher and $3\times10^{19}/cm^3$ or lower.

A thickness of the third semiconductor layer 23 is 100 nm or larger and 1000 nm or smaller, and preferably 200 nm or larger and 500 nm or smaller. As an example, the third semiconductor layer 23 is formed of p-type $Al_{0.04}Ga_{0.96}N$ having the thickness of 300 nm.

Seventh Semiconductor Layer 25

The nitride semiconductor device 1 of this embodiment is provided with the seventh semiconductor layer 25 formed on an upper surface of the third semiconductor layer 23.

The seventh semiconductor layer 25 is formed of GaN, AlGaN, or AlInGaN doped with a p-type impurity, and is preferably formed of p-type GaN. An impurity concentration of the seventh semiconductor layer 25 is higher than that of the third semiconductor layer 23, the impurity concentration is $5\times10^{19}/cm^3$ or higher and $3\times10^{20}/cm^3$ or lower, and preferably is $8\times10^{19}/cm^3$ or higher and $2\times10^{20}/cm^3$ or lower.

A thickness of the seventh semiconductor layer 25 is 5 nm or larger and 50 nm or smaller, and preferably 5 nm or larger and 20 nm or smaller. As an example, the seventh semiconductor layer 25 is formed of p-type GaN with the thickness of 15 nm. The seventh semiconductor layer 25 serves as a layer for forming ohmic contact with an electrode when forming the electrode thereon. However, when the ohmic contact between the third semiconductor layer 23 and the electrode may be formed, for example, when the impurity concentration of the third semiconductor layer 23 is high, the formation of the seventh semiconductor layer 25 may be omitted.

Each of the semiconductor layers (11, 13, 15, 17, 19, 21, 23, and 25) is formed, for example, by sequentially supplying a predetermined carrier gas and a source gas corresponding to the composition of each semiconductor layer during a predetermined time corresponding to the thickness in a MOCVD device.

[Validation]

Hereinafter, a point that luminous efficiency improves according to the nitride semiconductor light-emitting device 1 is described with reference to examples.

[Validation 1]

Figure 5:
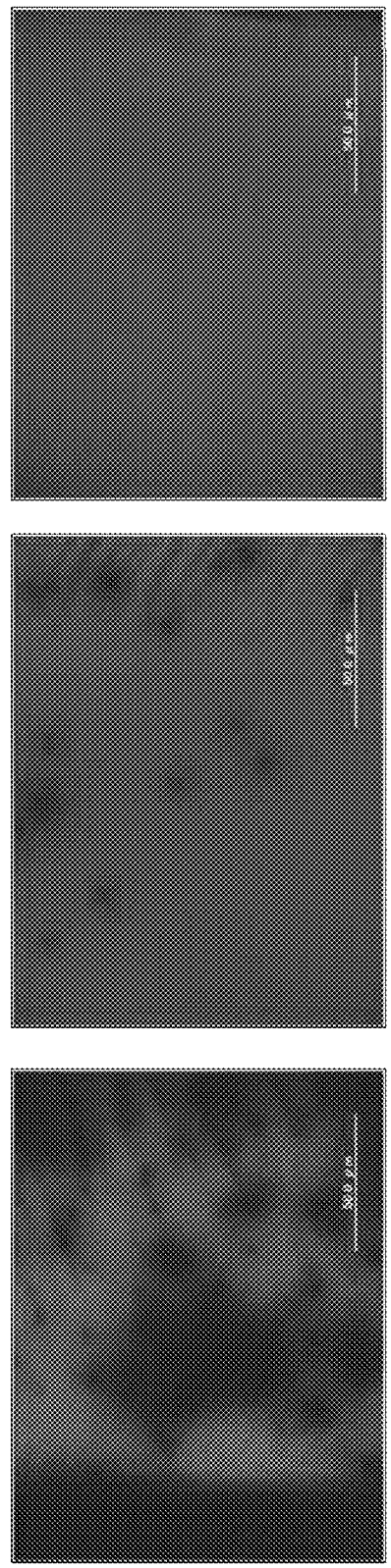
FIG. 5 illustrates fluorescence micrographs of the nitride semiconductor light-emitting devices manufactured with different off angles θ of 0.33°, 0.4°, and 0.5° of the nitride semiconductor substrates.

FIG. 5 illustrates fluorescence micrographs of the nitride semiconductor light-emitting devices 1 manufactured with different off angles θ of 0.33°, 0.4°, and 0.5° of the nitride semiconductor substrate 10. In further detail, they are photographs obtained by allowing light emitted from a fluorescence microscope to be incident on the active layer 17 to excite the active layer 17 and imaging a state of light emission in the active layer 17.

Figure 6:
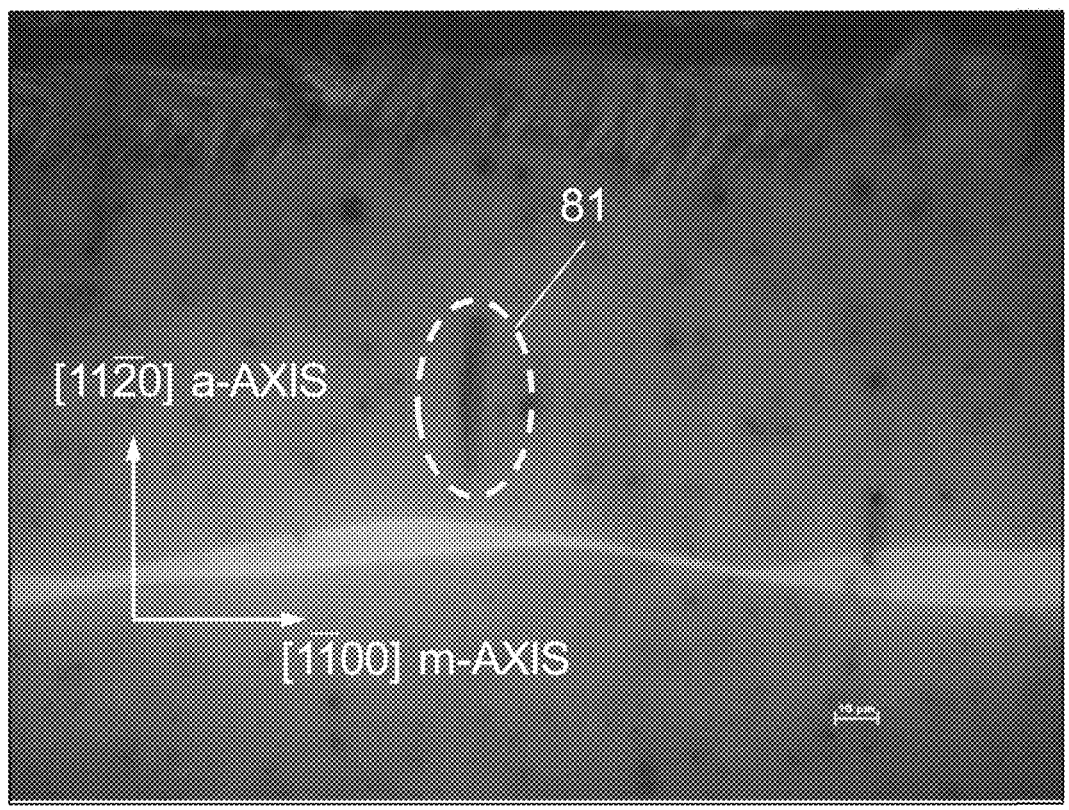
FIG. 6 illustrates a fluorescence micrograph of an active layer grown on an upper surface of the nitride semiconductor substrate having an off angle θ of 0.33°.

With reference to FIG. 5, it is understood that a spot-shaped or linear blackish area (dark spot area) decreases as the off angle θ increases. From this, it is confirmed that the number of dark spots in the active layer 17 may be decreased by increasing the off angle θ of the nitride semiconductor substrate 10. Note that, in order to confirm reproducibility, a total of three experiments were repeated using other substrates, but similar results were confirmed. Note that, FIG. 6 illustrates a fluorescence micrograph of the active layer 17 when the off angle θ is 0.33° in which a linear dark spot area 81 is found. Note that the above-described "spot-shaped or linear" dark spot area extends in a depth direction of a paper surface and forms a planar dark spot area (defect).

The inventors of the present application imagine a reason of this phenomenon as follows.

Figure 7A:
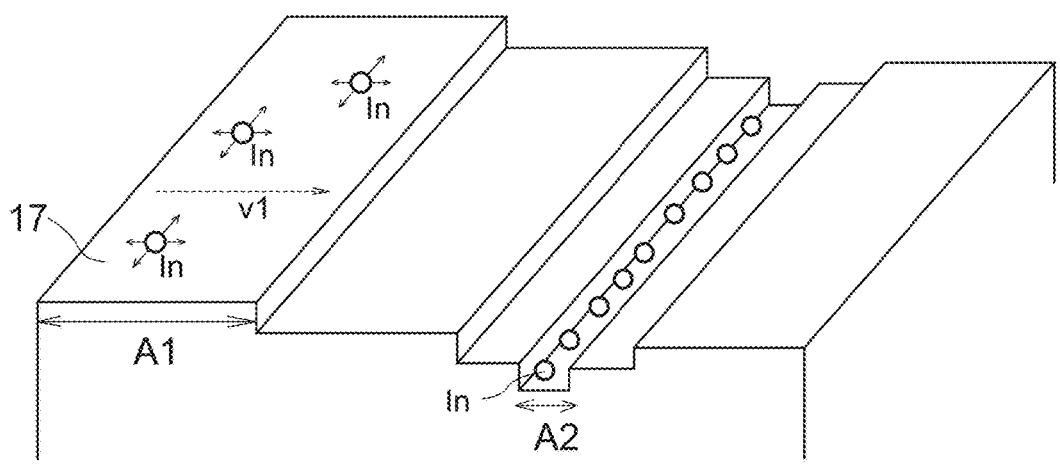
FIG. 7A is a view schematically illustrating a growth face of the active layer when the active layer is formed on the main surface of the nitride semiconductor substrate without the off angle.

When the off angle θ is not provided on the nitride semiconductor substrate (for example, GaN substrate), as illustrated in FIG. 7A, a growth face of the active layer 17 has a large terrace width in a horizontal direction. Note that, in FIG. 7A, an area A1 having a large terrace width and an area A2 having a small terrace width are present because a randomly formed microscopic unevenness is present on the main surface of the nitride semiconductor substrate, and the unevenness is continuously present in a process of growing the semiconductor layer.

When the semiconductor layer is grown on the nitride semiconductor substrate the main surface of which is the (0001) plane, the area A1 having the large terrace width is formed in a portion where the unevenness is not formed. When the active layer 17 grows in this area A1, a moving speed v1 in the horizontal direction of constituent atoms of the active layer 17 increases. As a result, an area where In is excessively taken is formed in a direction orthogonal to the direction in which the step is formed at a boundary position with the area A2 having the small terrace width in the portion in which the unevenness is formed. As a result, a dark spot portion is formed.

Figure 7B:
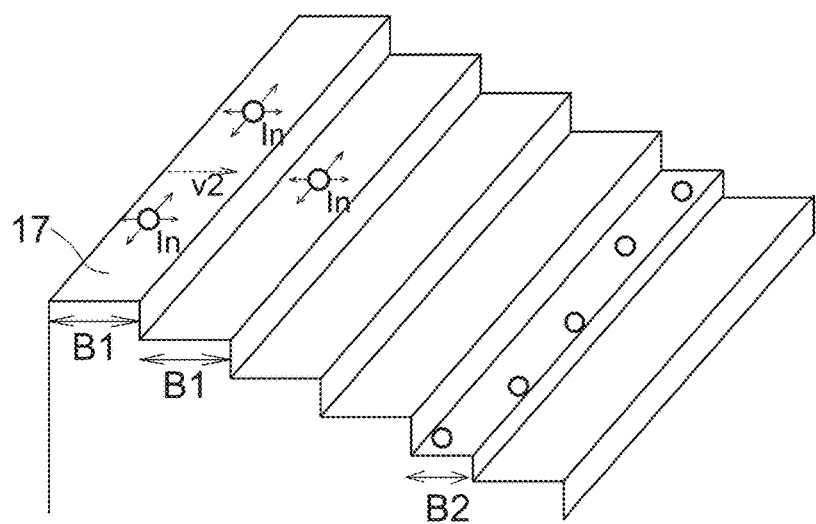
FIG. 7B is a view schematically illustrating a growth face of the active layer when the active layer is formed on the main surface of the nitride semiconductor substrate having the off angle.

On the other hand, when the semiconductor layer is grown on the nitride semiconductor substrate 10 provided with the main surface 10a having the off angle θ, as illustrated in FIG. 7B, a terrace width B1 parallel to the (0001) plane becomes smaller as compared with FIG. 7A. That is, a difference in terrace width is small between the portion where the unevenness is originally formed on the nitride semiconductor substrate 10 and the portion where the unevenness is not formed. Therefore, a difference is small between a speed v2 of moving on the area B1 having the large terrace width and a speed of moving on an area B2 having a small terrace width of the constituent atoms of the active layer 17. Thus, formation of the area in which In is excessively taken is suppressed.

In the above-described embodiment, although the case where the main surface 10a of the nitride semiconductor substrate 10 is inclined with respect to the (0001) plane in an m axis direction, that is, in the [1-100] direction by the off angle θ is described, the similar description may be made also when the main surface 10a is inclined in an axis direction, that is, in a [11-20] direction.

Note that this effect is more remarkable by allowing the active layer 17 (especially, well layer 17a) to contain Al. That is, when the active layer 17 is formed of AlInGaN, there is an effect of decreasing a diffusion length of In atoms by the Al atoms contained in the source gas during the growth of the active layer 17. This action works in a direction of decreasing the moving speed of the In atoms during the growth of the active layer 17, so that an effect of further alleviating segregation of In is obtained in combination with the provision of the off angle θ to decrease the terrace width.

[Validation 2]

Furthermore, according to the semiconductor light-emitting device 1 of this embodiment, the second semiconductor layer 15 formed of the nitride semiconductor containing In is provided below the active layer 17, that is, on the nitride semiconductor substrate 10 side. By growing the second semiconductor layer 15, lattice mismatch is alleviated and surface energy of a crystal is lowered, so that uniformity of In composition on the surface is enhanced. That is, it is imagined that by growing the active layer 17 thereon, segregation of In taken in the active layer 17 is alleviated, so that a phenomenon that In is taken in excess is further suppressed. In order to exhibit this effect, as described above, the In composition of the second semiconductor layer 15 is preferably 2% or higher, and the thickness is preferably 100 nm or larger.

As a comparative example, transition of a photoluminescence wavelength was compared between a case where weak excitation energy is applied and a case where strong excitation energy is applied to the nitride semiconductor light-emitting device obtained by growing the active layer 17 after growing the GaN layer in place of the second semiconductor layer 15. As a result, the wavelength was 480 nm at the time of weak excitation while the wavelength was 450 nm at the time of strong excitation. In contrast, as the example, when similar validation was performed on the nitride semiconductor light-emitting device 1 obtained by growing the active layer 17 after growing the second semiconductor layer 15 formed of InGaN, the wavelength was 455 nm at the time of weak excitation while the wavelength was 450 nm at the time of strong excitation.

A large shift amount of wavelength between the time of weak excitation and the time of strong excitation means that an area with large In composition and an area with small In composition are mixed in the active layer 17. That is, it is understood that fluctuation in In composition in the active layer 17 is alleviated by growing the active layer 17 after growing the second semiconductor layer 15 formed of InGaN as compared with a case of growing the active layer 17 after growing the GaN layer.

However, for this effect, the active layer 17 is not necessarily provided immediately above the second semiconductor layer 15, and it is sufficient that, after the second semiconductor layer 15 is formed, the active layer 17 is formed in the vicinity thereof within 500 nm from the upper surface thereof.

Note that, even when the second semiconductor layer 15 is not provided, if the main surface 10a of the nitride semiconductor substrate 10 has the off angle θ of 0.4° or larger with respect to the (0001) plane, the terrace width regarding a plane parallel to the main surface may be made small, so that an effect of alleviating excessive take-in of In may be obtained.

(Validation 3)

Figure 8:
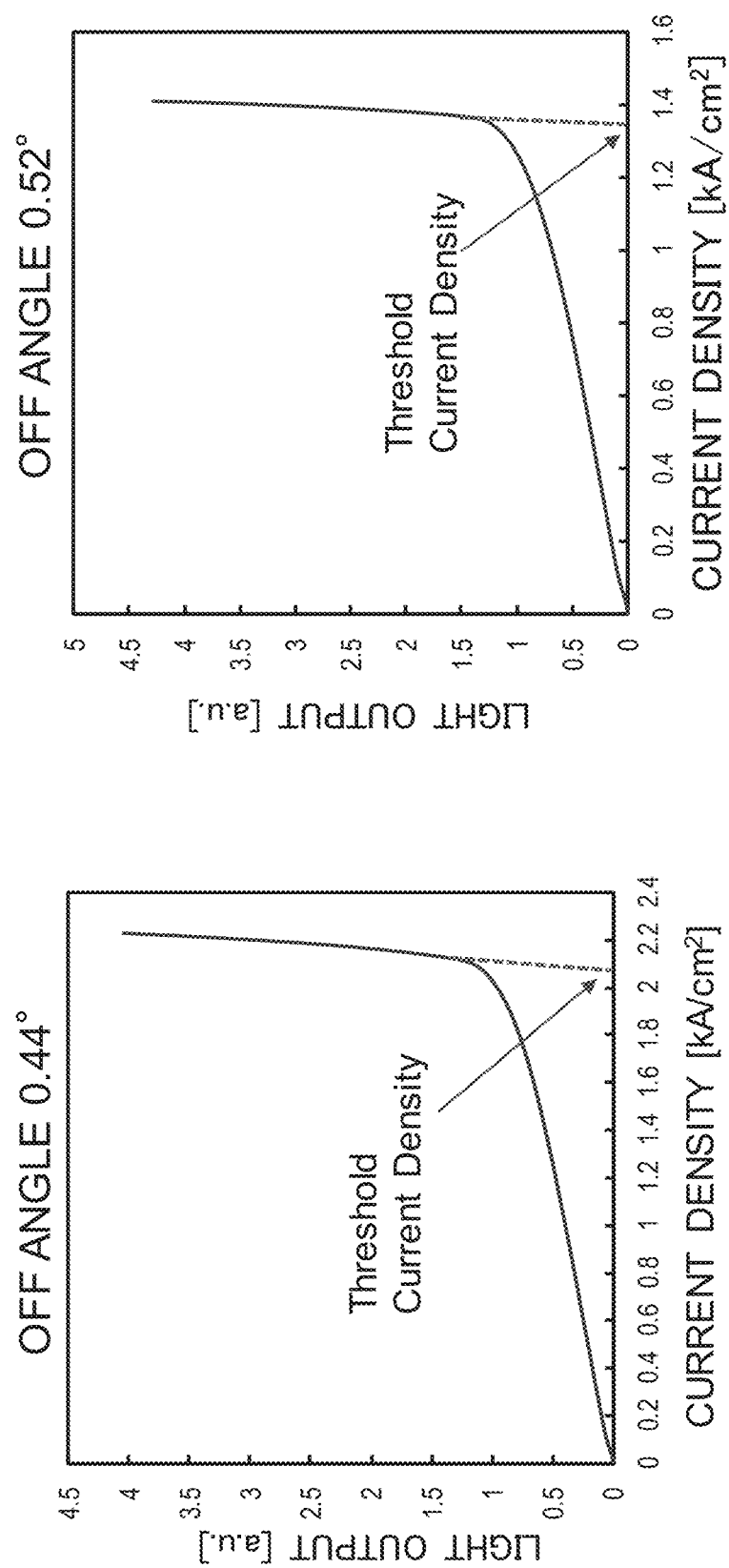
FIG. 8 is a graph illustrating L-I (light-current) characteristics when the nitride semiconductor light-emitting devices including the nitride semiconductor substrates having the off angles θ of 0.44° and 0.5° are realized as semiconductor laser devices.
Figure 9:
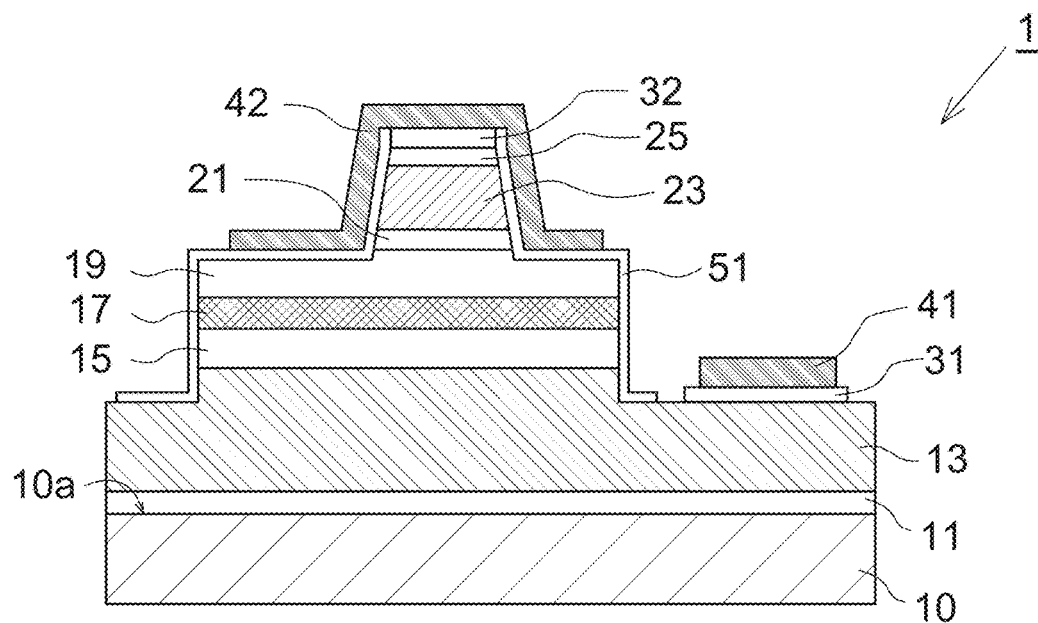
FIG. 9 is an example of a schematic cross-sectional view when the nitride semiconductor light-emitting device is realized as the semiconductor laser device.

FIG. 8 is a graph illustrating L-I (light-current) characteristics when the nitride semiconductor light-emitting devices 1 having the off angles θ of 0.44° and 0.5° are realized as semiconductor laser devices. FIG. 9 illustrates a configuration example of the semiconductor laser device used in this validation.

In FIG. 9, a first electrode 31 is formed on the first semiconductor layer 13, and a second electrode 32 is formed on the seventh semiconductor layer 25. On the electrodes (31, 32), pad electrodes (41, 42) for energization are formed, respectively. Also, a stacked body of the sixth semiconductor layer 21, the third semiconductor layer 23, the seventh semiconductor layer 25, and the second electrode 32 forms a ridge portion, and an insulating layer 51 is formed so as to cover an outer side surface of the ridge portion and an outer side surface of the semiconductor layers (15, 17, 19) including the active layer 17. The insulating layer 51 is formed of SiO$_2$, ZrO$_2$, Al$_2$O$_3$ or the like.

As illustrated in FIG. 9, the first semiconductor layer 13 is formed to have a larger width than that of the active layer 17 in a direction parallel to the main surface 10a of the nitride semiconductor substrate 10. The first electrode 31 is formed in a part of an area on which the active layer 17 is not formed out of the upper surface of the first semiconductor layer 13. In the nitride semiconductor light-emitting device 1 illustrated in FIG. 9, the first electrode 31 forms an n-side electrode. The first electrode 31 may be formed of, for example, Cr/Pt/Au, Cr/Au, Ti/Au, Ti/Al/Ti/Au, Ni/Au, Ni/Al/Ni/Ti/Pt/Au or the like. A thickness of the first electrode 31 is arbitrary, but is, for example, 100 nm or larger and 1000 nm or smaller.

A second electrode 32 is formed on the seventh semiconductor layer 25. In this embodiment, the second electrode 32 forms a p-side electrode. The second electrode 32 may be formed of, for example, ITO, Ni/Au, Pt/Au, Pd/Au or the like. Especially, it is possible to allow the second electrode 32 to serve as a part of a p-side cladding layer by forming the same of a transparent electrode material having high translucency to visible light and low refractive index such as ITO. A thickness of the second electrode 32 is arbitrary, but is, for example, 100 nm or larger and 500 nm or smaller.

On the upper surfaces of the first electrodes 31 and second electrodes 32, the pad electrodes (41, 42) for energization are formed, respectively. Each of the pad electrodes (41, 42) is formed of Ni/Ti/Au/Ti/Au, Ni/Ti/Au, Pt/Au or the like. A thickness of the pad electrode (41, 42) is arbitrary, but is, for example, 1 μm or larger and 10 μm or smaller.

FIG. 8 is a graph illustrating a relationship between current density supplied between the pad electrodes (41, 42) and a light output when the semiconductor laser devices as illustrated in FIG. 9 are formed with the off angle θ of the nitride semiconductor substrate 10 set to 0.44° and 0.5°. Oscillation wavelengths are 450 nm for both cases. From FIG. 8, it is understood that threshold current density is lower when the off angle θ is 0.5° than when the off angle θ is 0.44°. From this result also, it is confirmed that the formation of the dark spots in the active layer 17 is suppressed and an internal loss is decreased by increasing the off angle θ.

Note that, when the nitride semiconductor light-emitting device 1 is realized as the semiconductor laser device as illustrated in FIG. 9, if the inclination of the active layer 17 forming a waveguide for oscillation becomes too large, the inner loss is generated when the light is reflected on an end face of the active layer 17, so that the off angle θ is preferably 5° or smaller, more preferably 1° or smaller, and is especially preferably 0.7° or smaller.

Figure 10:
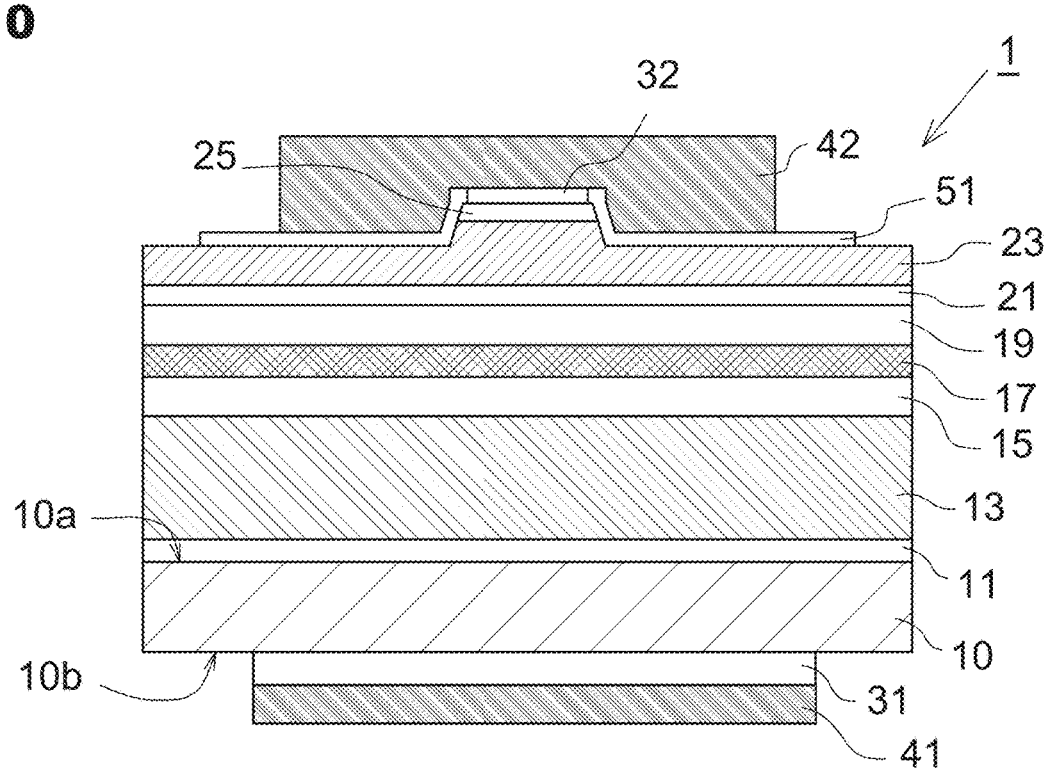
FIG. 10 is another example of the schematic cross-sectional view when the nitride semiconductor light-emitting device is realized as the semiconductor laser device.

Note that, when the nitride semiconductor light-emitting device 1 is realized as the semiconductor laser device, as illustrated in FIG. 10, one electrode 31 may be formed on the rear surface 10b side of the nitride semiconductor substrate 10, and the other electrode 32 may be formed on the main surface 10a side of the nitride semiconductor substrate 10.

Another Embodiment

Hereinafter, another embodiment of the nitride semiconductor light-emitting device 1 is described.

<1> It is possible that the nitride semiconductor light-emitting device 1 is not provided with the fourth semiconductor layer 11. In this case, the first semiconductor layer 13 is formed on the main surface 10a of the nitride semiconductor substrate 10 having the off angle θ.

<2> It is possible that the nitride semiconductor light-emitting device 1 is not provided with the second semiconductor layer 15. In this case, the active layer 17 is formed on the upper surface of the first semiconductor layer 13.

<3> It is possible that the nitride semiconductor light-emitting device 1 is not provided with the fifth semiconductor layer 19. In this case, the sixth semiconductor layer 21 or the third semiconductor layer 23 is formed on the upper surface of the active layer 17.

<4> It is possible that the nitride semiconductor light-emitting device 1 is not provided with the sixth semiconductor layer 21. In this case, the third semiconductor layer 23 is formed on the upper surface of the active layer 17 via the fifth semiconductor layer 19 or directly. However, by providing the sixth semiconductor layer 21, recombination probability in the active layer 17 is further increased, so that an emission characteristic is further improved.

<5> The examples in which the nitride semiconductor light-emitting device 1 is realized as the semiconductor laser device are illustrated in FIGS. 9 and 10, but this structure is merely an example.

For example, in the example illustrated in FIG. 9, it is possible that the semiconductor layer (13, 11) below the first electrode 31 is removed by etching and the first electrode 31 is formed on an upper surface of the nitride semiconductor substrate 10. In addition, it is possible that another nitride semiconductor layer (A) is formed between the nitride semiconductor substrate 10 and the first semiconductor layer 13, the first semiconductor layer 13 below the first electrode 31 is removed by etching, and the first electrode 31 is formed on the upper surface of the nitride semiconductor layer (A).

<6> In the above-described embodiment, it is described that the first semiconductor layer 13 is the n-type semiconductor layer and the third semiconductor layer 23 is the p-type semiconductor layer, but the conductivity type may be reversed.

What is claimed is:

1. A nitride semiconductor light-emitting device comprising:
    a nitride semiconductor substrate including a main surface having an off angle of 0.4° to 5° with respect to a (0001) plane;
    a first semiconductor layer formed of an n-type or p-type AlGaN or AlInGaN formed on the main surface of the nitride semiconductor substrate;
    a second semiconductor layer formed of a nitride semiconductor having In composition of 2% or higher formed on the first semiconductor layer;
    an active layer formed on the second semiconductor layer including a well layer formed of a nitride semiconductor having In composition higher than the In composition of the second semiconductor layer and a barrier layer formed of a nitride semiconductor stacked therein;
    a third semiconductor layer formed on the active layer having a conductivity type different from the conductivity type of the first semiconductor layer; and
    a fourth semiconductor layer formed between the main surface of the nitride semiconductor substrate and the first semiconductor layer, and formed of a nitride semiconductor having In composition of 2% or higher, the In composition lower than the In composition of the well layer, wherein
    the first semiconductor layer has a lower In composition than the fourth semiconductor layer.

2. The nitride semiconductor light-emitting device according to claim 1, wherein
    the off angle is 0.5° to 1.0°.

3. The nitride semiconductor light-emitting device according to claim 1, wherein
the second semiconductor layer has a thickness of 100 nm or larger.

4. The nitride semiconductor light-emitting device according to claim 1, wherein
the second semiconductor layer includes a surface which is in contact with the active layer.

5. The nitride semiconductor light-emitting device according to claim 1, wherein
the nitride semiconductor substrate includes the main surface inclined in a <1-100> direction with respect to the (0001) plane.

6. The nitride semiconductor light-emitting device according to claim 1, wherein
the barrier layer is formed of a nitride semiconductor containing In and Ga.

7. The nitride semiconductor light-emitting device according to claim 1, wherein
the second semiconductor layer is formed in a position within 500 nm toward the nitride semiconductor substrate from a surface on a side closer to the nitride semiconductor substrate of the active layer.

8. The nitride semiconductor light-emitting device according to claim 1, wherein
the well layer is formed of a nitride semiconductor of which In composition is 10% or higher.

9. The nitride semiconductor light-emitting device according to claim 1, wherein
the well layer is formed of a nitride semiconductor containing Al.

10. The nitride semiconductor light-emitting device according to claim 1, wherein
the nitride semiconductor light-emitting device is a laser device.

* * * * *